United States Patent
Yamamoto

(10) Patent No.: US 11,153,999 B2
(45) Date of Patent: Oct. 19, 2021

(54) WORK MACHINE

(71) Applicant: FUJI CORPORATION, Chiryu (JP)

(72) Inventor: Yasunobu Yamamoto, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 228 days.

(21) Appl. No.: 16/469,904

(22) PCT Filed: Dec. 16, 2016

(86) PCT No.: PCT/JP2016/087526
§ 371 (c)(1),
(2) Date: Jun. 14, 2019

(87) PCT Pub. No.: WO2018/109921
PCT Pub. Date: Jun. 21, 2018

(65) Prior Publication Data
US 2019/0364706 A1 Nov. 28, 2019

(51) Int. Cl.
*B23P 19/00* (2006.01)
*H05K 13/04* (2006.01)
*H05K 13/08* (2006.01)

(52) U.S. Cl.
CPC ....... *H05K 13/041* (2018.08); *H05K 13/0409* (2018.08); *H05K 13/0812* (2018.08); *Y10T 29/53174* (2015.01)

(58) Field of Classification Search
CPC ............... H05K 13/08; H05K 13/0815; H05K 13/0404; H05K 13/0411; H05K 13/0069;
(Continued)

(56) References Cited

U.S. PATENT DOCUMENTS 10,362,719 B2 * 7/2019 Iisaka ................ H05K 13/0408
2017/0156243 A1 6/2017 Iisaka et al.

FOREIGN PATENT DOCUMENTS

JP 2000-91795 A 3/2000
JP 2002-111287 A 4/2002
(Continued)

OTHER PUBLICATIONS

Extended European Search Report dated Nov. 26, 2019 in European Patent Application No. 16923954.8, 7 pages.
(Continued)

*Primary Examiner* — Thiem D Phan
(74) *Attorney, Agent, or Firm* — Oblon, McClelland, Maier & Neustadt, L.L.P.

(57) ABSTRACT

In mounter, work using multiple suction nozzles is executed by executing an exchange of suction nozzles between nozzle station and mounting head. In addition, placement positions of suction nozzles at nozzle station are set so that the distance between accommodation section at the nozzle station and part camera is shorter for the suction nozzle to be exchanged more times at the nozzle station. Then, for exchange of suction nozzles during mounting work, the suction nozzle attached to the mounting head is returned to a placement section corresponding to a set placement position. As a result, placement positions at the nozzle station are rearranged into the set placement positions, so that the distance that the mounting head moves for nozzle exchange can be made shorter, which makes it possible to reduce the time required for nozzle exchange.

2 Claims, 7 Drawing Sheets

(58) Field of Classification Search
CPC ........... H05K 13/0406; H05K 13/0417; H05K 13/02; H05K 13/04; H05K 13/0409; H05K 13/0419; H05K 2201/09927; H05K 3/30; Y10T 29/53174; Y10T 29/53178; Y10T 29/4913; Y10T 29/53191; Y10T 29/53261; G05B 19/4183; G06T 2207/10004; G06T 2207/30141; H04N 5/2253; H04N 7/183; Y10S 269/903
USPC ......... 29/739, 428, 707, 740, 743, 760, 832, 29/834, 836
See application file for complete search history.

(56) References Cited

FOREIGN PATENT DOCUMENTS

| | | |
|---|---|---|
| JP | 2002-208798 A | 7/2002 |
| JP | 2005-150325 A | 6/2005 |
| WO | WO 2015/151246 A1 | 10/2015 |

OTHER PUBLICATIONS

International Search Report dated Mar. 21, 2017 in PCT/JP2016/087526 filed on Dec. 16, 2016.

\* cited by examiner

WORK MACHINE

TECHNICAL FIELD

The present application relates to a work machine in which work using multiple holding tools can be executed by enabling an exchange of those holding tools between a work head and a holding tool station.

BACKGROUND ART

Some work machines perform work using multiple holding tools by executing an exchange of the holding tools between a work head and a holding tool station. Specifically, a holding tool station includes multiple placement sections where holding tools are placed, and a holding tool detached from a holding head is placed in any one of the multiple placement sections and a holding tool placed in an placement section other than that placement section is attached to the holding head, so that the exchange of holding tools is conducted between the holding head and the holding tool station. The following patent literature describes an example of such a work machine.

PATENT LITERATURE

Patent Literature 1: JP-A-2002-208798

BRIEF SUMMARY

Technical Problem

Although the work using multiple holding tools can be executed by exchanging the holding tools, when a time spent exchanging holding tools becomes long, a reduction in cycle time cannot be attained. The present disclosure has been made in view of these situations, and an object thereof is to shorten a time to be spent exchanging holding tools.

Solution to Problem

To achieve the object, according to the description, there is provided a work machine including: a work head to which a holding tool configured to hold a component is attached detachably and which is configured to perform work with the holding tool attached thereto; a holding tool station including multiple placement sections for placing multiple of the holding tools and configured to enable an exchange of the holding tools between the work head and the holding tool station by allowing the holding tool attached to the work head to be placed in any one of the multiple placement sections and allowing the holding tool placed in any other of the placement sections to be attached to the work head; and a control device configured to cause the work head to execute work using the multiple holding tools by enabling an exchange of the holding tools at the holding tool station, wherein the control device comprises: a mounting section configured to attach any one of the multiple holding tools placed in the multiple placement sections to the work head at the holding tool station before the work head starts work; and a returning section configured to, when placement positions at the holding tool station where the multiple holding tools used for work by the work head are placed are each set according to a predetermined condition and the placement positions so set are designated as set placement positions, return the holding tool attached to the work head to the placement section corresponding to the set placement position regardless of the placement section where the holding tool was originally placed in executing an exchange of the holding tools at the holding tool station during execution of work by the work head.

Advantageous Effects

According to this disclosure, in exchanging the holding tools during mounting work, the holding tool attached to the work head is returned to the placement section corresponding to the preset placement position. As a result, when making use of return of the holding tools to the holding tool station, the placement positions of the holding tools on the holding tool station can be rearranged into an alignment of placement positions that is set, for example, so as to reduce a time required for an exchange of the holding tools.

DESCRIPTION OF EMBODIMENTS

Hereinafter, embodiments of the present disclosure will be described in detail by reference to drawings.

(A) Configuration of Electronic Component Mounting System

Figure 1:
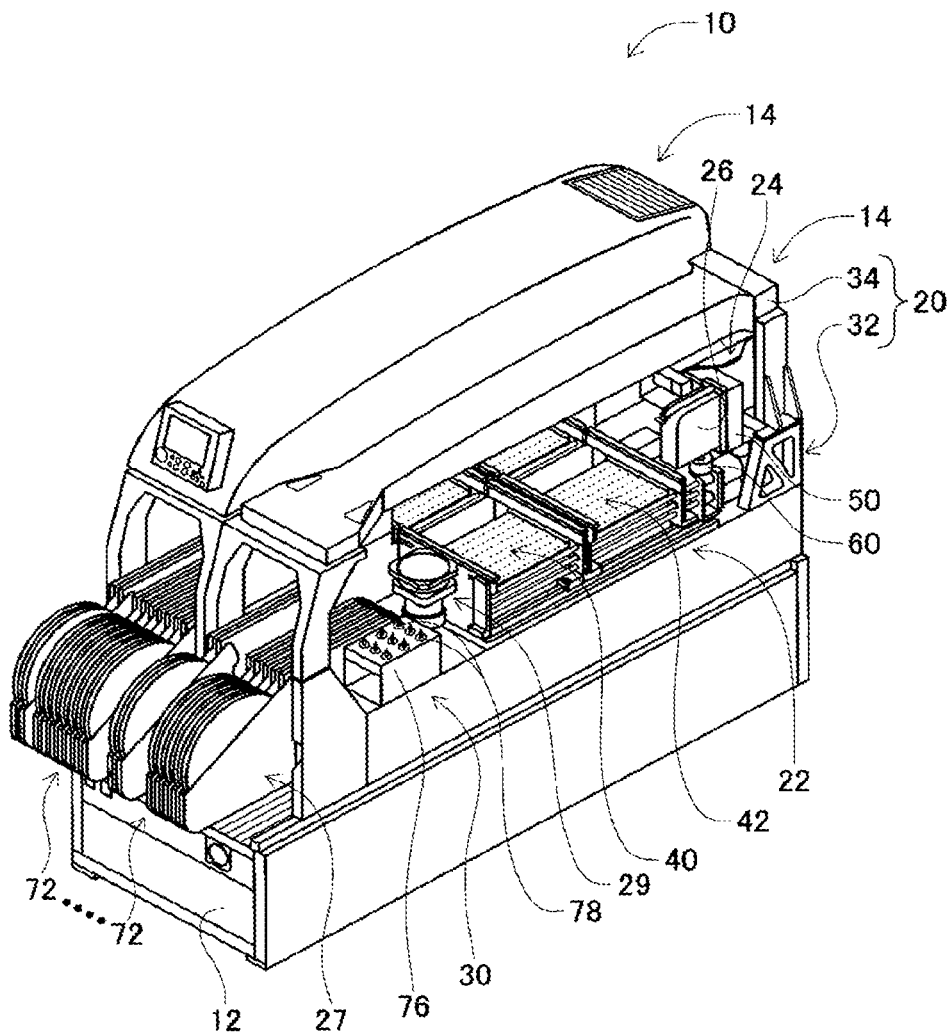
FIG. 1 is a perspective view illustrating an electronic component mounter.

FIG. 1 illustrates electronic component mounting system 10. Electronic component mounting system 10 includes one system base 12, and two electronic component mounters (hereinafter, also referred to simply as "mounters") 14 that are disposed side by side on system base 12. A direction in which mounters 14 are aligned side by side is referred to as an X-axis direction, and a horizontal direction perpendicular to the X-axis direction is referred to as the Y-axis direction.

Each mounter 14 mainly includes mounter main body 20, conveyance device 22, mounting head moving device (hereinafter, referred to simply as a "moving device") 24, mounting head 26, supply device 27, mark camera (refer to FIG. 3) 28, part camera 29, nozzle station 30, and control device (refer to FIG. 3) 31. Mounter main body 20 includes frame section 32 and beam section 34 provided to extend over frame section 32.

Conveyor device 22 includes two conveyor devices, 40 and 42. The two conveyor devices 40 and 42 are provided parallel to each other and in such a manner as to extend in the X-axis direction on frame section 32. The two conveyor devices 40 and 42 convey circuit boards supported on conveyor devices 40 and 42 in the X-axis direction by electromagnetic motors (refer to FIG. 3) 46. The circuit boards are fixedly held in a predetermined position by board holding device (refer to FIG. 3) 48.

Moving device 24 is an XY-robot-type moving device. Moving device 24 includes electromagnetic motor (refer to FIG. 3) 52 configured to slide slider 50 in the X-axis direction and electromagnetic motor (refer to FIG. 3) 54 configured to slide slider 50 in the Y-axis direction. Mounting head 26 is attached to slider 50, and mounting head 26 is moved to any position on frame section 32 by operations of two electromagnetic motors 52 and 54.

Figure 2:
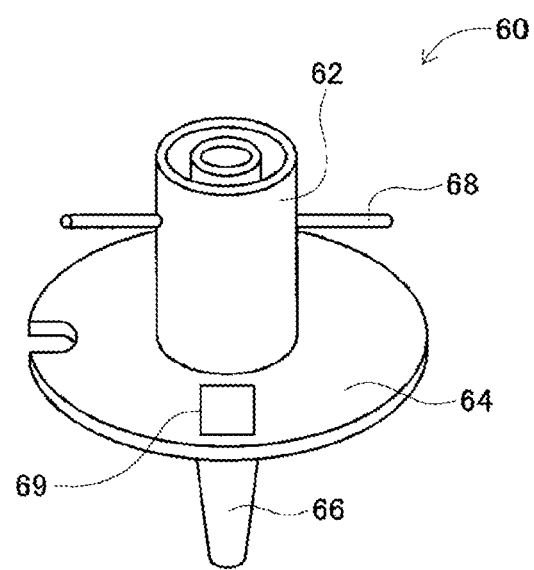
FIG. 2 is a perspective view illustrating a suction nozzle.

Mounting head 26 mounts electronic components on a circuit board. Mounting head 26 includes one mounting unit (not illustrated), and suction nozzle 60 is attached to a tip portion of the mounting unit. That is, mounting head 26 is a type of head configured to hold one suction nozzle 60. As illustrated in FIG. 2, suction nozzle 60 includes body cylinder 62, flange section 64, suction pipe 66, and locking pin 68. Body cylinder 62 has a cylindrical shape, and flange section 64 is fixed to an outer peripheral surface of body cylindrical 62 in such a manner as to protrude therefrom. 2D code 69 is given to an upper face of flange section 64. 2D code 69 is an identification mark for use in identifying unique information on suction nozzle 60.

Suction pipe 66 has a thin pipe shape and is held to body cylinder 62 in such a manner as to move in an axial line direction while extending downwards from a lower end portion of body cylinder 62. Locking pin 68 is provided at an upper end portion of body cylinder 62 in such manner as to extend in a radial direction of body cylinder 62. Suction nozzle 60 is attached detachably to the mounting unit through a single action by making use of locking pin 68. Then, suction nozzle 60 attached to the mounting unit is connected with positive and negative pressure supply device (refer to FIG. 3) 70 by way of a negative pressure air passage and a positive pressure air passage. As a result, suction nozzle 60 picks up and holds an electronic component using negative pressure and releases the electronic component held using positive pressure. The mounting unit is lifted up and down by unit lifting and lowering device (refer to FIG. 3) 71. As a result, a position of an electronic component picked up and held by suction nozzle 60 in an up-down direction is changed.

Supply device 27 is a feeder-type supply device and includes multiple tape feeders 72 as illustrated in FIG. 1. Tape feeder 72 holds taped components that are wound therearound. Taped components are electronic components that are taped or fixed to a tape. Then, tape feeder 72 feeds out taped components using feeding device (refer to FIG. 3) 74. As a result, feeder-type supply device 27 supplies electronic components to a supply position by feeding out taped components.

Mark camera (refer to FIG. 3) 28 is fixed to slider 50 of moving device 24 facing downwards and is moved to any position by operations of moving device 24. As a result, mark camera 28 images any position on frame section 32. Part camera 29 is disposed on an upper face of frame section 32 between conveyance device 22 and supply device 27 facing upwards. As a result, part camera 29 images suction nozzle 60 attached to mounting head 26 or a component held to suction nozzle 60.

Nozzle station 30 includes nozzle tray 76. Multiple accommodation sections 78 for placing suction nozzles 60 are formed on nozzle tray 76. In this nozzle station 30, suction nozzle 60 attached to mounting head 26 is automatically exchanged for suction nozzles 60 placed in accommodation sections 78 of nozzle tray 76. Nozzle tray 76 can be detachably attached to nozzle station 30, whereby suction nozzles 60 placed on nozzle tray 76 can be exchanged for other suction nozzle trays 60 outside mounter 14.

Figure 3:
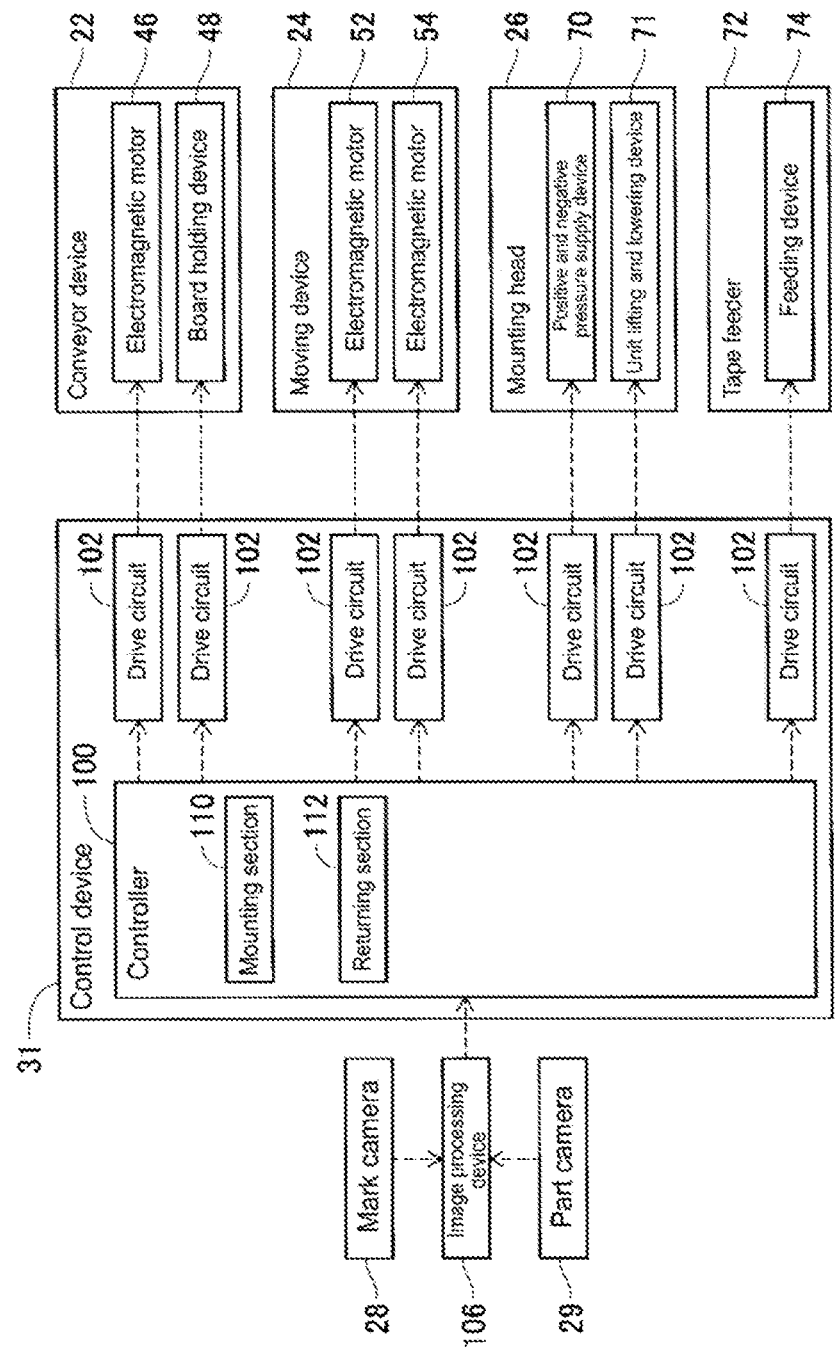
FIG. 3 is a block diagram illustrating a control device.

Control device 31 includes controller 100 and multiple drive circuits 102 as illustrated in FIG. 3. Multiple drive circuits 102 are connected to electromagnetic motors 46, 52, and 54, board holding device 48, positive and negative pressure supply device 70, unit lifting and lowering device 71, and feeding device 74. Controller 100 includes CPU, ROM, RAM, and the like and is thus mainly composed of a computer, being connected to multiple drive circuits 102. As a result, operations of conveyance device 22, moving device 24, and the like are controlled by controller 100. Controller 100 is also connected to image processing device 106. Image processing device 106 constitutes a device configured to process image data that is captured by mark camera 28 and part camera 29. Thus, controller 100 acquires various pieces of information from the image data.

(B) Mounting Work by Mounter

In mounter 14, as a result of the configuration described above, mounting work can be executed on a circuit board held by conveyance device 22 by mounting head 26. Specifically, a circuit board is conveyed to a working position by a command from controller 100, and the circuit board is fixedly held in that working position by board holding device 48. Next, mark camera 28 moves to a position above the circuit board based on a command from controller 100 and images the circuit board. As a result, information on the holding position of the circuit board and the like can be obtained. Tape feeder 72 feeds out a taped component to supply an electronic component in the supply position based on commands from controller 100. Then, mounting head 26 moves to above the electronic component supply position to pick up and hold an electronic component using suction nozzle 60 based on a command from controller 100. Subsequently, mounting head 26 moves to above part camera 29, so that the electronic component held by suction nozzle 60 is imaged by part camera 29. As a result, information on a posture of the held component can be obtained. Then, mounting head 26 moves to above the circuit board and mounts the electronic component on the circuit board based on the position where the circuit board is held and the posture of the electronic component held by the suction nozzle.

Suction nozzles 60 that are attached to mounting head 26 are exchanged according to sizes, shapes and the like of electronic components that are attached to a circuit board. Specifically, for example, suction nozzle 60 with a small nozzle diameter, in other words, a small size, is used for mounting a small electronic component, whereas suction nozzle 60 with a large nozzle diameter, in other words, a large size, is used for mounting a large electronic component. Thus, when mounting head 26 to which suction nozzle 60 with a small diameter is attached completes mounting work with that particular suction nozzle 60 with a small diameter, mounting head 26 moves to above nozzle station 30. Suction nozzle 60 with a large diameter is placed in one accommodation section 78 of multiple accommodation sections 78 on nozzle tray 76 of nozzle station 30, and another accommodation section 78 is vacant, that is, no suction nozzle 60 is placed therein.

Then, suction nozzle 60 attached to mounting head 26 that moves to above nozzle station 30 is placed in the vacant accommodation section 78 at nozzle tray 76. As a result, no suction nozzle 60 is currently attached to mounting head 26. Subsequently, suction nozzle 60 with a large diameter placed in accommodation section 78 is attached to mounting head 26. As a result, exchange work of suction nozzles 60 at nozzle station 30 is completed. Then, when the exchange work of suction nozzles 60 is completed, mounting head 26 moves to above part camera 29, so that suction nozzle 60 attached to mounting head 26 is imaged by part camera 29. As a result, information on suction nozzle 60 attached to mounting head 26 is obtained, whereby whether appropriate suction nozzle 60, that is, suction nozzle 60 with a large diameter is attached to mounting head 26 is confirmed. At this time, when it is determined that appropriate suction nozzle 60 is attached to mounting head 26, mounting work using that particular suction nozzle 60 is executed. Electronic components of various sizes and shaped can be attached to a circuit board by exchanging suction nozzles 60 according to mounting target electronic components in the way described above.

(C) Accommodation Positions of Suction Nozzles on Nozzle Tray

As has been described above, after the exchange work of suction nozzles 60 is completed at nozzle station 30, suction nozzle 60 attached to mounting head 26 is imaged by part camera 29, and whether appropriate suction nozzle 60 is attached to mounting head 26 is confirmed. At this time, a reduction in cycle time can be achieved by reducing the distance that mounting head 26 moves, that is, the distance between the position where suction nozzles 60 are exchanged and the position where part camera 29 is disposed. That is, the cycle time can be reduced by placing suction nozzles 60 at nozzle tray 76 of nozzle station 30 in such a manner as to reduce the distance that mounting head 26 moves for nozzle exchange. In reality, however, the operator places at random multiple suction nozzles 60 necessary for mounting work at nozzle tray 76.

Figure 4:
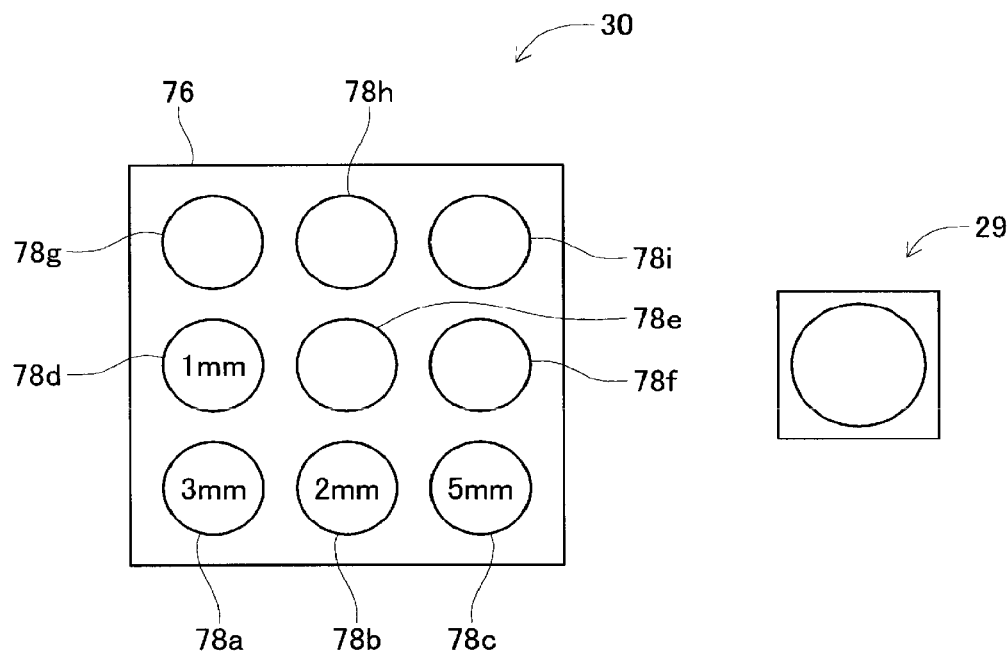
FIG. 4 is a conceptual diagram illustrating accommodation positions of suction nozzles on a nozzle station.

Specifically, as illustrated in FIG. 4, nine accommodation sections 78 are formed in such a manner as to be arranged in three rows and three columns on nozzle tray 76 of nozzle station 30. Note that, to distinguish the nine accommodation sections 78 from one another, the nine accommodation sections 78 will be referred to as accommodation sections 78a to 78i. Then, for example, when suction nozzles 60 of four types are necessary for mounting work, including a suction nozzle with a nozzle diameter of 1 mm (hereinafter, also referred to as a "suction nozzle (1 mm)"), a suction nozzle with a nozzle diameter of 2 mm (hereinafter, also referred to as a "suction nozzle (2 mm)"), a suction nozzle with a nozzle diameter of 3 mm (hereinafter, also referred to as a "suction nozzle (3 mm)"), and a suction nozzle with a nozzle diameter of 5 mm (hereinafter, also referred to as a "suction nozzle (5 mm)"), the operator places suction nozzles 60 of the four types at random in four accommodation sections 78 in nine accommodation sections 78. In FIG. 4, the suction nozzle (3 mm) is placed in accommodation section 78a, the suction nozzle (2 mm) is placed in accommodation section 78b, the suction nozzle (5 mm) is placed in accommodation section 78c, and the suction nozzle (1 mm) is placed in accommodation section 78d. In FIG. 4, although the nozzle diameters are given in the interior of accommodation sections 78 for suction nozzles 60 of the four types, in reality, the nozzle diameters are not given in accommodation sections 78. The operator removes nozzle tray 76 from nozzle station 30 and places suction nozzles 60 at nozzle tray 76 outside mounter 14.

Then, when nozzle tray 76 is returned to nozzle station 30, suction nozzles 60 placed at nozzle tray 76 are individually attached to mounting head 26 as required. Specifically, mark camera 28 is moved to above nozzle station 30, so that nozzle tray 76 is imaged by mark camera 28. Then, controller 100 specifies, out of the nine accommodation sections 78, the accommodation sections 78 where suction nozzles 60 are placed and accommodation sections 78 that are vacant based on the captured image data. When the nozzle tray 76 is imaged, 2D codes 69 of suction nozzles 60 placed in accommodation sections 78 are also imaged, whereby controller 100 also specifies the types of suction nozzles 60 placed in accommodation sections 78 based on the captured image data of 2D code 69. As a result, controller 100 specifies that suction nozzles 60 of the four types are placed at nozzle tray 76 in a form illustrated in FIG. 4.

Next, when the accommodation positions of suction nozzles 60 at nozzle tray 76 are specified, suction nozzle 60 necessary for mounting work is attached to mounting head 26, and the mounting work is executed by suction nozzle 60 attached to mounting head 26. For example, when the suction nozzle (1 mm) is necessary for mounting work, mounting head 26 moves to above accommodation section 78d, whereby the suction nozzle (1 mm) is attached to mounting head 26. When the mounting work by the suction nozzle (1 mm) is completed, the suction nozzle (1 mm) is returned to accommodation section 78d, and then, suction nozzle 60 necessary for next mounting work is attached to mounting head 26. That is, suction nozzle 60 removed from accommodation section 78 and attached to mounting head 26 is returned to accommodation section 78 where the suction nozzle is placed originally when mounting work using suction nozzle 60 is completed. Thus, the accommodation positions of suction nozzles 60 during the mounting work are maintained to the accommodation positions in the form illustrated in FIG. 4, that is, the accommodation positions where the operator places the suction nozzles at random.

In the form illustrated in FIG. 4, however, suction nozzles 60 are not placed in accommodation sections 78f and 78i that are relatively near to part camera 29, but suction nozzles 60 are placed in accommodation sections 78a and 78d that are relatively far away from part camera 29. In this case, if suction nozzles 60 are placed in accommodation sections 78a and 78d that are relatively far away from part camera 29, mounting head 26 may move a relatively long distance when moving to above part camera 29 after suction nozzle 60 placed in accommodation section 78a or 78d is attached to mounting head 26, so that the cycle time becomes long.

Figure 5:
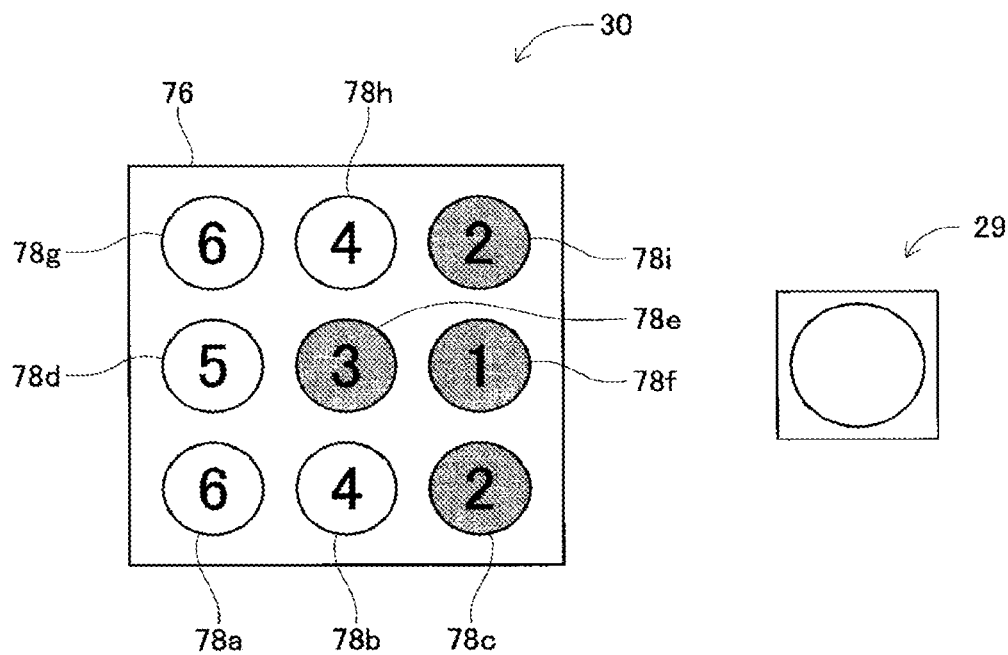
FIG. 5 is a conceptual diagram illustrating an order of priority among accommodation positions of suction nozzles on the nozzle station.

In view of this, accommodation positions of suction nozzles 60 are determined so as to reduce distances between accommodation sections 78 and part camera 29. Specifically, firstly, an order of priority among accommodation positions is set in the order of their decreasing distances between accommodation sections 78 and part camera 29. That is, as illustrated in FIG. 5, in the nine accommodation sections 78, priority order number 1 or a first priority is set for accommodation section 78f positioned rightmost in the middle row, and priority order number 2 or a second priority is set for accommodation sections 78c and 78i that are positioned rightmost in the lower row and the upper row, respectively. Next, priority order number 3 or a third priority is set for accommodation section 78e positioned central or intermediate in the middle row, and priority order number 4 or a fourth priority is set for accommodation sections 78b and 78h that are positioned central or intermediate in the lower row and the upper row, respectively. Then, priority order number 5 or a fifth priority is set for accommodation section 78d positioned leftmost in the middle row, and priority order number 5 or a fifth priority is set for accommodation sections 78a and 78g that are positioned leftmost in the lower row and the upper row, respectively. Note that although FIG. 5 shows the priority order number inside each accommodation section 78, no priority order numbers are given on actual accommodation sections 78.

Then, accommodation positions for suction nozzles 60 of the four types for use in mounting are determined to be accommodation sections 78 of higher priorities. Specifically, accommodation positions for suction nozzles 60 of the four types are determined to be accommodation section 78c, accommodation section 78e, accommodation section 78f, and accommodation section 78i (shaded accommodation sections 78 in FIG. 5). In other words, accommodation positions for suction nozzles 60 are determined to be accommodation sections 78c, 78f, and 78i that are situated relatively near part camera 29, whereas accommodation positions for suction nozzles 60 are not determined to be accommodation sections 78a, 78d, and 78g that are situated relatively far away from part camera 29. This can reduce the distance that mounting head 26 moves to above part camera 29 after suction nozzles 60 placed in accommodation section 78c, 78f, or 78i is attached to mounting head 26, so that the cycle time decreases.

Although the respective accommodation positions of multiple suction nozzles 60 for use in mounting work are determined in accordance with the priority order set in this manner, taking the number of times suction nozzles 60 are to be exchanged into consideration can contribute to a further reduction in cycle time. Specifically, after suction nozzle 60 of a different type is attached to mounting head 26 as a result of exchange of suction nozzles 60, mounting head 26 moves from above nozzle station 30 to above part camera 29, and thus, as the number of times suction nozzles 60 are exchanged increases, the number of times mounting head 26 moves from nozzle station 30 to part camera 29 increases. Thus, the accommodation position for each of multiple suction nozzles 60 may be determined so that the distance between accommodation section 78 and part camera 29 is shorter for suction nozzle 60 to be exchanged more times, which can further reduce the distance that mounting head 26 moves and further reduce the cycle time. That is, the accommodation position for each of multiple suction nozzles 60 may be determined in such a manner that accommodation section 78 of a higher priority is determined for suction nozzle 60 to be exchanged more times, which can further reduce the distance that mounting head 26 moves and further reduce the cycle time.

Figure 6:
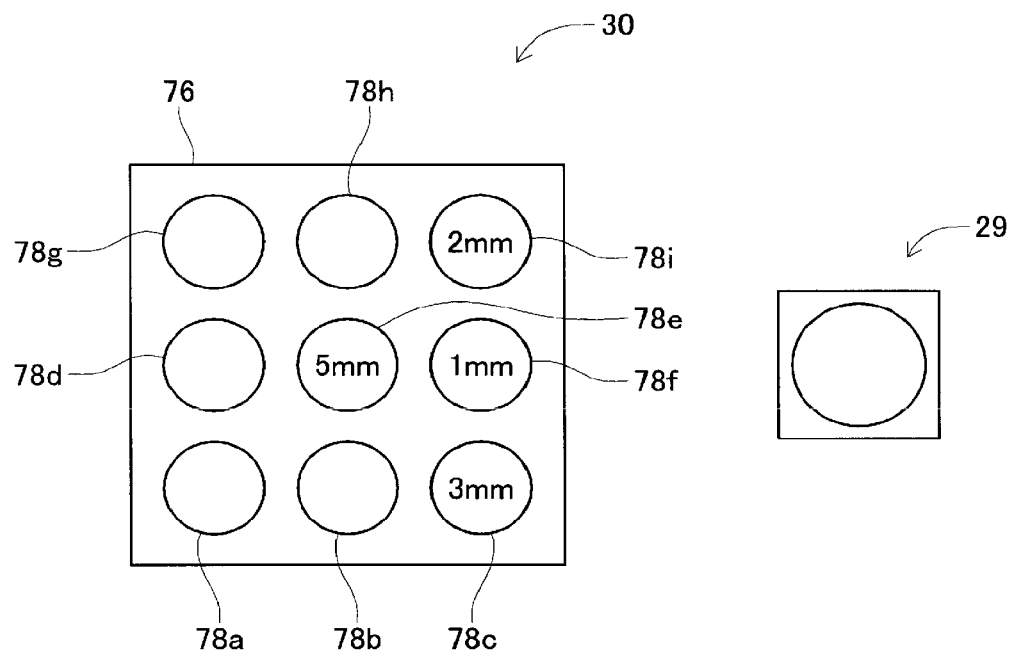
FIG. 6 is a conceptual diagram illustrating accommodation positions of suction nozzles on the nozzle station.

Thus, for example, accommodation positions illustrated in FIG. 6 are determined in the case where the suction nozzle (1 mm) is to be exchanged five times, the suction nozzle (2 mm) is to be exchanged four times, the suction nozzle (3 mm) is to be exchanged three times, and the suction nozzle (5 mm) is to be exchanged twice. In this mode, the accommodation position for the suction nozzle (1 mm) to be exchanged five times is determined to be accommodation section 78f positioned rightmost in the middle row, the accommodation position for the suction nozzle (2 mm) to be exchanged four times is determined to be accommodation section 78i positioned rightmost in the upper row, the accommodation position for the suction nozzle (3 mm) to be exchanged three times is determined to be accommodation section 78c positioned rightmost in the lower row, and the accommodation position for the suction nozzle (5 mm) to be exchanged twice is determined to be accommodation section 78e positioned central or intermediate in the middle row. Since the priority order of accommodation section 78c is the same as the priority order of accommodation section 78i, although the accommodation position of the suction nozzle (2 mm) can be exchanged for the accommodation position of the suction nozzle (3 mm), since almost nothing is changed even though the accommodation positions are so exchanged for, the form illustrated in FIG. 6 is determined as the accommodation positions for suction nozzles 60 of the four types.

Placing suction nozzles 60 in the accommodation positions determined in the way described above can shorten the distance that mounting head 26 moves for nozzle exchange, thereby making it possible to reduce the cycle time. That is, the accommodation positions of suction nozzles 60 that are determined according to the method described above are optimum accommodation positions for a reduction in cycle time, and the accommodation positions of suction nozzles 60 that are determined according to the method described above are referred to as optimum accommodation positions. Then, the operator checks the optimum accommodation positions and places suction nozzles 60 at nozzle tray 76, so that the cycle time can be reduced. However, the operator feels overloaded when he or she is forced to place suction nozzles 60 in the optimum accommodation positions.

Then, it can be considered that the operator places suction nozzles 60 at nozzle tray 76 at random, and suction nozzles 60 placed at random are automatically rearranged into the optimum accommodation positions by mounting head 26 at nozzle station 30 as setup work before actual mounting work is started. However, when suction nozzles 60 are rearranged as setup work, the start of mounting work is delayed, resulting in fears that the cycle time becomes long.

In view of this, in mounter 14, suction nozzle 60 attached to mounting head 26 is returned to accommodation section 78 corresponding to the optimum accommodation position for that particular suction nozzle 60 when an exchange of suction nozzles 60 is executed at nozzle station 30 during execution of mounting work. That is, although conventionally, suction nozzle 60 attached to mounting head 26 is returned to the accommodation section where that particular suction nozzle 60 is originally placed (hereinafter, also referred to as an "original accommodation section" from time to time) for nozzle exchange, in mounter 14, suction nozzle 60 attached to mounting head 26 is returned to accommodation section 78 corresponding to its optimum accommodation position, without taking into consideration its original accommodation section.

Specifically, a case will be described in which the operator places suction nozzles 60 of the four types in the manner illustrated in FIG. 4, and controller 100 stores the accommodation positions in the manner illustrated in FIG. 6 as the optimum accommodation positions. Let's assume that an order in which suction nozzles 60 are used for mounting work starts from the suction nozzle (1 mm), and the suction nozzle (2 mm), the suction nozzle (3 mm), and the suction nozzle (5 mm) follow sequentially in that order. Firstly, to execute mounting work using suction nozzle (1 mm), the suction nozzle (1 mm) is picked up from accommodation section 78d and is attached to mounting head 26. As a result, accommodation section 78d becomes vacant. Controller 100 stores accommodation section 78d as being vacant due to suction nozzle 60 being picked up therefrom to be attached to mounting head 26.

Then, when the mounting work using the suction nozzle (1 mm) is completed, controller 100 determines whether the optimum accommodation position (refer to FIG. 6) of the suction nozzle (1 mm), that is, accommodation section 78f is vacant. As described above, controller 100 calculates the accommodation positions in the form illustrated in FIG. 4 based on the captured image data obtained by mark camera 28 and stores them. In addition, controller 100 stores accommodation sections 78 that become vacant as a result of suction nozzles being picked up therefrom to be attached to mounting head 26. That is, controller 100 always stores the state of accommodation of suction nozzles 60 at nozzle tray 76, which continuously changes in association with the exchange of suction nozzles. This allows controller 100 to determine whether suction nozzle 60 is placed in a predetermined accommodation section, that is, the presence or absence of suction nozzle 60 in predetermined accommodation section 78.

Figure 7:
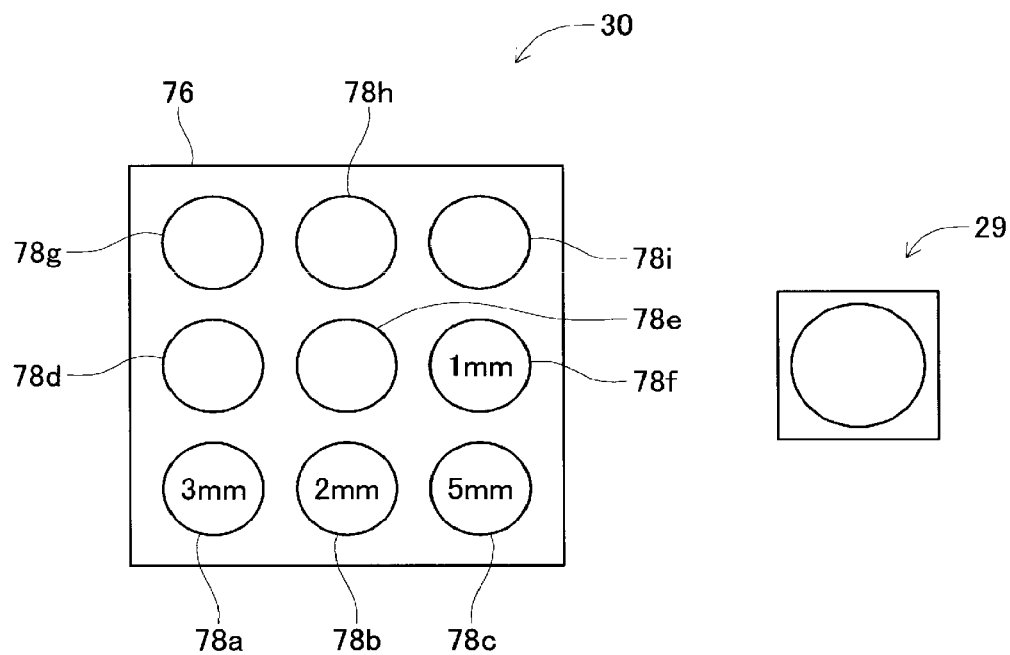
FIG. 7 is a conceptual diagram illustrating accommodation positions of suction nozzles on the nozzle station.

Then, when determining that no suction nozzle 60 is placed in accommodation section 78*f*, which is the optimum accommodation position (refer to FIG. 6) of the suction nozzle (1 mm), controller 100 returns the suction nozzle (1 mm) to accommodation section 78*f* as illustrated in FIG. 7. Then, controller 100 stores accommodation section 78*f* as a new accommodation position of the suction nozzle (1 mm). Next, to execute mounting work using the suction nozzle (2 mm), the suction nozzle (2 mm) is picked up from accommodation section 78*b* and is attached to mounting head 26. As a result, accommodation section 78*b* becomes vacant, and controller 100 stores accommodation section 78*b* as being vacant due to the suction nozzle being picked up therefrom to be attached to mounting head 26.

Figure 8:
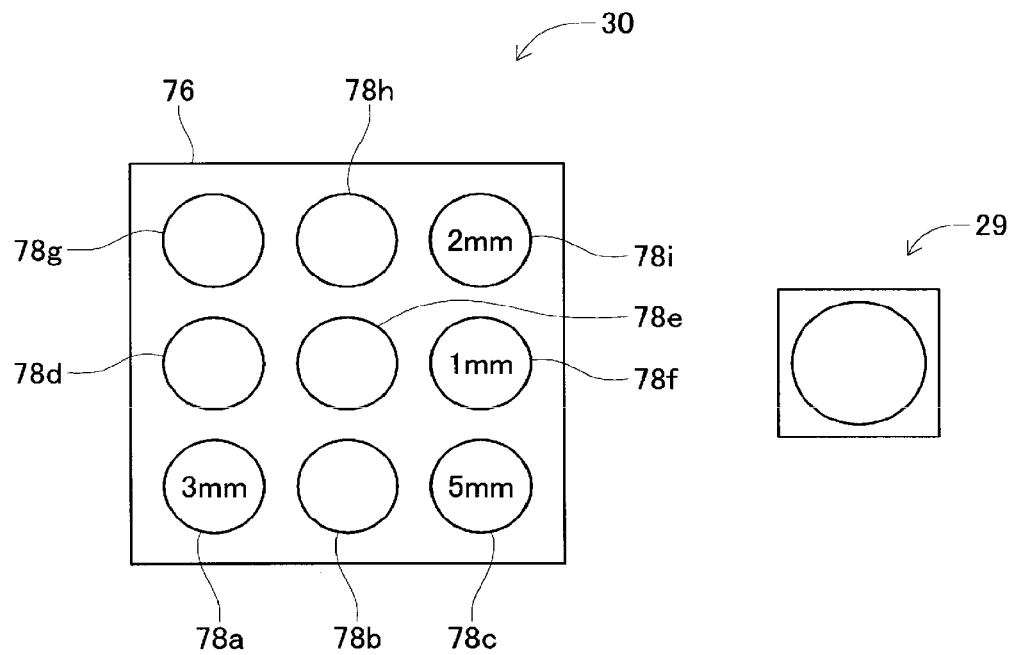
FIG. 8 is a conceptual diagram illustrating accommodation positions of suction nozzles on the nozzle station.

Then, when the mounting work using the suction nozzle (2 mm) is completed, controller 100 determines whether the optimum accommodation position (refer to FIG. 6) of the suction nozzle (2 mm), that is, accommodation section 78*i* is vacant. At this time, controller 100 determines based on the state of accommodation of suction nozzles 60 at nozzle tray 76 that no suction nozzle 60 is placed in accommodation section 78*i*, which is the optimum accommodation position (refer to FIG. 6) of the suction nozzle (2 mm). As a result, as illustrated in FIG. 8, controller 100 returns the suction nozzle (2 mm) to accommodation section 78*i*. Then, controller 100 stores accommodation section 78*i* as a new accommodation position of the suction nozzle (2 mm).

Subsequently, to execute mounting work using the suction nozzle (3 mm), the suction nozzle (3 mm) is picked up from accommodation section 78*a* and is attached to mounting head 26. As a result, accommodation section 78*a* becomes vacant, and controller 100 stores accommodation section 78*a* as being vacant due to the suction nozzle being picked up therefrom to be attached to mounting head 26. Then, when the mounting work using the suction nozzle (3 mm) is completed, controller 100 determines whether the optimum accommodation position (refer to FIG. 6) of the suction nozzle (3 mm), that is, accommodation section 78*c* is vacant.

At this time, controller 100 determines based on the state of accommodation of suction nozzles 60 at nozzle tray 76 that suction nozzle 60 is placed in accommodation section 78*c*, which is the optimum accommodation position (refer to FIG. 6) of the suction nozzle (3 mm). In this manner, when controller 100 determines that another suction nozzle 60 is placed in a planned return position of suction nozzle 60 attached to mounting head 26, that is, accommodation section 78 corresponding to its optimum accommodation position, controller 100 temporarily returns suction nozzle 60 attached to mounting head 26 to accommodation section 78 that differs from the planned return position. That is, controller 100 determines accommodation section 78 that differs from the planned return position as a temporary accommodation section and returns temporarily suction nozzle 60 attached to mounting head 26 to the temporary accommodation section.

Figure 9:
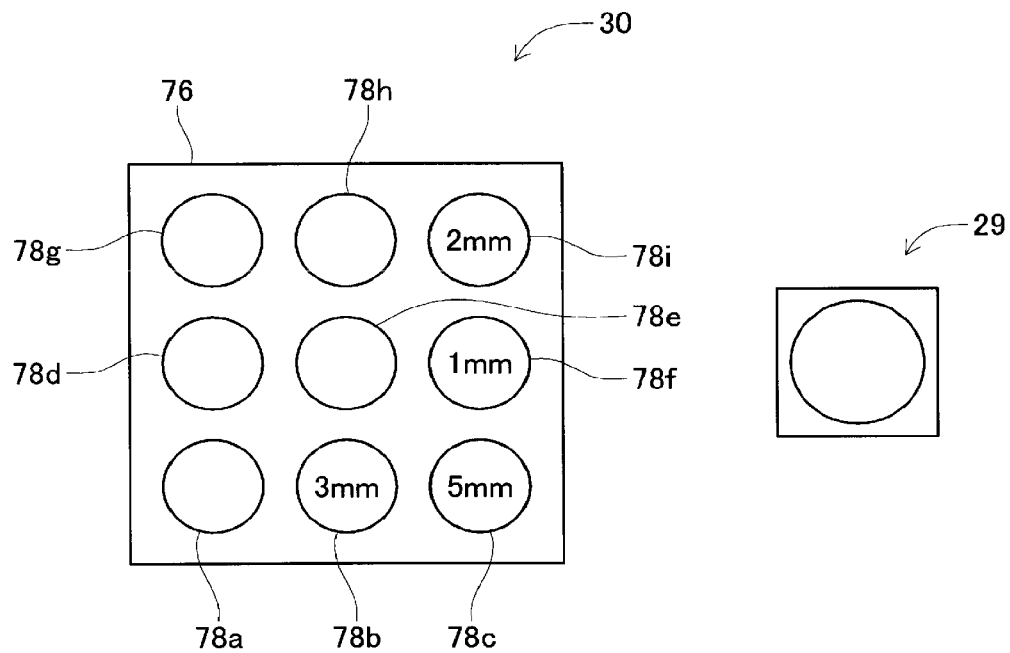
FIG. 9 is a conceptual diagram illustrating accommodation positions of suction nozzles on the nozzle station.

In the nine accommodation sections 78, accommodation section 78 where no suction nozzle 60 is placed, which is excluded from accommodation sections 78 which are determined as the optimum accommodation positions, and which is situated nearest to the planned return position is determined as the temporary accommodation section. Thus, in the mode illustrated in FIG. 8, since suction nozzles 60 are already placed in accommodation sections 78*a*, 78*c*, 78*f*, and 78*i*, accommodation section 78*e* is the optimum accommodation position of the suction nozzle (5 mm), and accommodation section 78*c* is the planned return position, accommodation section 78*b* is determined as the temporary accommodation section. Then, as illustrated in FIG. 9, the suction nozzle (3 mm) is returned to accommodation section 78*b*. Controller 100 stores accommodation section 78*b* as a new accommodation position of the suction nozzle (3 mm).

Subsequently, to execute mounting work using the suction nozzle (5 mm), the suction nozzle (5 mm) is picked up from accommodation section 78*c* and is attached to mounting head 26. As a result, accommodation section 78*c* becomes vacant, and controller 100 stores accommodation section 78*c* as being vacant due to the suction nozzle being picked up therefrom to be attached to mounting head 26. Then, when the mounting work using the suction nozzle (5 mm) is completed, controller 100 determines whether the optimum accommodation position (refer to FIG. 6) of the suction nozzle (5 mm), that is, accommodation section 78*e* is vacant.

Figure 10:
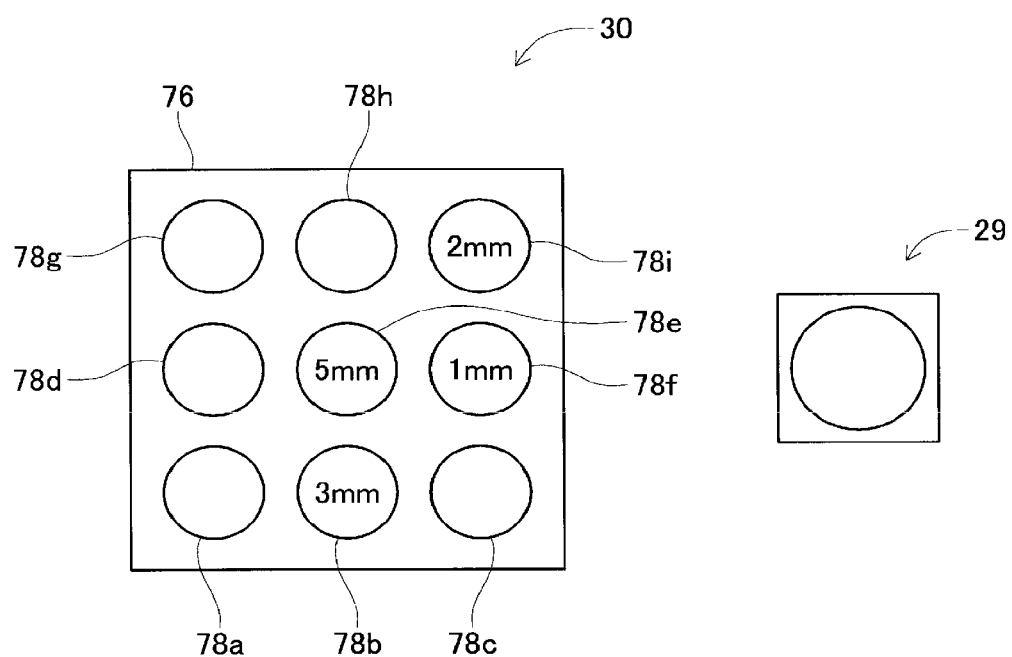
FIG. 10 is a conceptual diagram illustrating accommodation positions of suction nozzles on the nozzle station.

At this time, controller 100 determines based on the state of accommodation of suction nozzles 60 at nozzle tray 76 that no suction nozzle 60 is placed in accommodation section 78*e*, which is the optimum accommodation position (refer to FIG. 6) of the suction nozzle (5 mm). As a result, as illustrated in FIG. 10, controller 100 returns the suction nozzle (5 mm) to accommodation section 78*e*. Then, controller 100 stores accommodation section 78*e* as a new accommodation position of the suction nozzle (5 mm).

In addition, accommodation section 78*c*, which is the optimum accommodation position (refer to FIG. 6) of the suction nozzle (3 mm), becomes vacant as a result of the suction nozzle (5 mm) being placed in the new accommodation position. Thus, the suction nozzle (3 mm) is picked up from the temporary accommodation section, that is, accommodation section 78*b* and is attached to mounting head 26. At this time, accommodation section 78*b* becomes vacant, and controller 100 stores accommodation section 78*b* as being vacant due to the suction nozzle being picked up therefrom to be attached to mounting head 26. Then, the suction nozzle (3 mm) attached to mounting head 26 is returned to accommodation section 78*c*, which is the optimum accommodation position (refer to FIG. 6) of the suction nozzle (3 mm). As a result, as illustrated in FIG. 6, all suction nozzles 60 of the four types are placed in their optimum accommodation positions.

As described above, in mounter 14, suction nozzle 60 attached to mounting head 26 is sequentially returned to accommodation section 78 corresponding to its optimum accommodation position every time an exchange of suction nozzles 60 is executed at nozzle station 30 in the midst of execution of mounting work. That is, suction nozzles 60 placed at random by the operator are rearranged in their optimum accommodation positions by making use of events where suction nozzles 60 are returned to nozzle tray 76 for exchange of suction nozzles 60 during mounting work. As a result, suction nozzles 60 can be placed in their optimum accommodation positions without increasing the load of the operator and preventing a delay in starting mounting work due to setup work.

As illustrated in FIG. 3, controller 100 includes mounting section 110 and returning section 112. Mounting section 110 constitutes a functional section configured to pick up any suction nozzle 60 from nozzle tray 76 where suction nozzles 60 are placed at random by the operator to be attached to mounting head 26. Returning section 112 constitutes a functional section configured to return suction nozzle 60 attached to mounting head 26 to accommodation section 78 corresponding to its optimum accommodation position.

Note that, in the above embodiment, mounter 14 is an example of a work machine. Mounting head 26 is an example of a work head. Part camera 29 is an example of an imaging device. Nozzle station 30 is an example of a holding tool station. Suction nozzle 60 is an example of a holding tool. Accommodation section 78 is an example of a placement section. Mounting section 110 is an example of a mounting section. Returning section 112 is an example of a returning section.

In addition, the present disclosure is not limited to the embodiment that has been described heretofore and hence can be carried out in various forms modified or improved based on the knowledge of those skilled in the art to which the present disclosure pertains. Specifically, for example, in the embodiment, mounting head 26 of the type holding one suction nozzle 60 is adopted; however, a mounting head of a type holding multiple suction nozzles 60 can be adopted. With mounting head 26 of the type holding one suction nozzle 60, since suction nozzle 60 attached to mounting head 26 is returned to accommodation section 78 that differs from its original accommodation section, when placing suction nozzles, the operator cannot place suction nozzles 60 at nozzle tray 76 to a full extent. That is, at least one vacant accommodation section 78 needs to left so that suction nozzle 60 attached to mounting head 26 is returned thereto. On the other hand, with the mounting head of the type holding multiple suction nozzles 60, since multiple accommodation sections 78 become vacant as a result of multiple suction nozzles 60 being picked up therefrom to be attached to the mounting head, when placing suction nozzles, the operator can place suction nozzles 60 at nozzle tray 76 to a full extent.

REFERENCE SIGNS LIST

14: mounter (work machine); 26: mounting head (work head); 29: part camera (imaging device); 30: nozzle station (holding tool station); 60: suction nozzle (holding tool); 78: accommodation section (placement section); 110: mounting section; 112: returning section.

The invention claimed is:

1. A work machine comprising:
a work head to which a holding tool configured to hold a component is attached detachably and which is configured to perform work with the holding tool attached thereto;
a holding tool station including multiple placement sections for placing multiple of the holding tools and configured to enable an exchange of the holding tools between the work head and the holding tool station by allowing the holding tool attached to the work head to be placed in any one of the multiple placement sections and allowing the holding tool placed in any other of the multiple placement sections to be attached to the work head;
an imaging device configured to image the holding tool attached to the work head; and
a control device configured to cause the work head to execute work using the multiple holding tools by enabling an exchange of the holding tools at the holding tool station, the control device comprises:
a mounting section configured to attach any one of the multiple holding tools placed in the multiple placement sections to the work head at the holding tool station before the work head starts work; and
a returning section configured to return the holding tool attached to the work head to the placement section corresponding to a set placement position of multiple placement positions regardless of the placement section where the holding tool was originally placed in executing an exchange of the holding tools at the holding tool station during execution of work by the work head, the set placement position determined so that a distance between the placement section and the imaging device is shorter for the holding tool to be exchanged more times at the holding tool station.

2. The work machine according to claim 1, wherein when another holding tool is placed in a placement section corresponding to the set placement position, the returning section temporarily returns the holding tool attached to the work head to a different placement section that differs from the placement section corresponding to the set placement position, and then, after the placement section corresponding to the set placement position becomes vacant in association with an exchange of the another holding tool at the holding tool station, the returning section returns the holding tool that is temporarily returned to the different placement section to the placement section corresponding to the set placement position.

* * * * *